(12) United States Patent
Dick

(10) Patent No.: US 8,774,324 B2
(45) Date of Patent: Jul. 8, 2014

(54) SYSTEMS AND METHODS FOR CHANGING DECODING PARAMETERS IN A COMMUNICATION SYSTEM

(75) Inventor: Christopher H. Dick, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 236 days.

(21) Appl. No.: 13/326,220

(22) Filed: Dec. 14, 2011

(65) Prior Publication Data

US 2013/0156118 A1 Jun. 20, 2013

(51) Int. Cl.
*H04L 27/06* (2006.01)

(52) U.S. Cl.
USPC ......................................................... 375/340

(58) Field of Classification Search
USPC .......... 375/262, 265, 316, 341; 714/786, 792, 714/794–795
See application file for complete search history.

(56) References Cited

U.S. PATENT DOCUMENTS

| | | | | |
|---|---|---|---|---|
| 5,446,747 A * | 8/1995 | Berrou | ........................... | 714/788 |
| 6,614,858 B1 * | 9/2003 | Pekarich et al. | .............. | 375/340 |
| 6,885,710 B1 * | 4/2005 | Park et al. | ...................... | 375/340 |
| 8,261,170 B2 * | 9/2012 | Yedidia et al. | ................. | 714/794 |
| 2002/0010894 A1 | 1/2002 | Wolf et al. | | |
| 2002/0023246 A1 * | 2/2002 | Jin | ................................. | 714/755 |
| 2002/0168033 A1 | 11/2002 | Suzuki et al. | | |
| 2010/0080562 A1 * | 4/2010 | Perkins et al. | ................... | 398/98 |
| 2011/0113294 A1 * | 5/2011 | Chugg et al. | ................... | 714/704 |
| 2011/0246850 A1 | 10/2011 | Rault et al. | | |

OTHER PUBLICATIONS

Boutillon, E., et al., VLSI Architectures for the Forward-Backward Algorithm, pp. 1-27, Aug. 1998, University of Toronto, Ontario Canada.

\* cited by examiner

*Primary Examiner* — Khanh C Tran
(74) *Attorney, Agent, or Firm* — Chad R. Walsh; W. Eric Webostad

(57) ABSTRACT

A communication system includes an iterative multi-stage decoder that may be dynamically configured to achieve a particular bit-error-rate. In one embodiment, a circuit comprises a first decoder block and a second decoder block to decode data received over a communication channel. A control circuit may change a number of iterations performed by the decoder blocks to decode received data based on a specified bit error rate and a detected signal-to-noise ratio of said received data. The number of computational units used in the decoders may be changed dynamically to achieve desired system performance. In one embodiment, resources are allocated based on a system initiating the connection. Programmable circuits are used in some embodiments to reconfigure the multi-stage decoder.

20 Claims, 5 Drawing Sheets

SYSTEMS AND METHODS FOR CHANGING DECODING PARAMETERS IN A COMMUNICATION SYSTEM

FIELD OF THE INVENTION

Embodiments of the present disclosure relate to integrated circuit devices (ICs). More particularly, an embodiment relates to a systems and methods of changing decoding parameters in a communication system.

BACKGROUND

Communication systems are used to deliver information. Communication systems may be used to send information (e.g., data) from one electronic system to another electronic system. The sending electronic system typically includes a transmitter for processing data for transmission across a communication channel. The receiving electronic system includes a receiver for processing signals received across the communication channel. Typically, data is generated by one electronic system and forwarded to the transmitter, and the transmitter processes the data for transmission across the channel. Similarly, the receiver processes the received signal and forwards the data to a second electronic system.

Communication systems typically code data prior to transmission. For example, a receiver may code the data using a particular coding scheme, and the transmitter that receives the data uses a decoding scheme to recover the encoded data. The decoding scheme typically takes into account the particular coding scheme used to code the data. Coding the data helps to reduce and/or recover errors in the data that may occur during transmission across the communication channel.

In many communication applications, data processing for coding and/or decoding is a primary constraint of the system. For example, in a cellular communication system, a base station may be required to decode data from many cellular handsets. Thus, decoding in a base station may be very hardware intensive, and may account for over fifty (50) percent of the cost of the physical layer of the base station. Furthermore, data rates of 100 Mbps in some systems are moving to gigabit rates in next generation systems. Computational complexity requirements involve on the order of 500 GOPs (where "OPs" employ on the order of 8- to 12-bit precision variables) of processing power for some base stations. Generally, it would be advantageous to have more efficient techniques for decoding data in a communication system.

SUMMARY

In one embodiment, a processing method comprises specifying a bit error rate, receiving an encoded data signal in a receiver, detecting a signal-to-noise ratio for the encoded data signal, determining a number of decoding iterations for an iterative decoding algorithm to achieve the specified bit error rate for the detected signal-to-noise ratio; and processing the encoded data signal digitally in an iterative multi-stage decoder in the receiver, wherein the iterative multi-stage decoder performs said iterative decoding algorithm for said determined number of decoding iterations.

In one embodiment, the method further comprises reconfiguring the iterative multi-stage decoder based on changes to the detected signal-to-noise ratio to maintain the specified bit error rate.

In one embodiment, reconfiguring the iterative multi-stage decoder comprises changing a number of computational units operating in each stage of the iterative multi-stage decoder.

In one embodiment, at least a portion of the iterative multi-stage decoder is configured on a programmable circuit, and reconfiguring the iterative multi-stage decoder comprises partially reconfiguring the programmable circuit with a different number of computational units based on said detecting the signal-to-noise ratio for the encoded digital data signal.

In one embodiment, the computational units comprise Add-Compare-Select (ACS) operational units with an offset.

In one embodiment, the iterative multi-stage decoder is a Turbo decoder.

In one embodiment, the iterative multi-stage decoder is a Low Density Parity Check (LDPC) decoder.

In another embodiment, the present invention includes a circuit comprising a first decoder block to receive systematic data and first parity bits, wherein the first parity bits are generated by coding the systematic data using a first coding algorithm, a second decoder block to receive interleaved systematic data and second parity bits, wherein the second parity bits are generated by coding interleaved systematic data before transmission using said first coding algorithm so that the first parity bits and second parity bits are substantially uncorrelated, and a control circuit, the control circuit changing a number of iterations performed by the first decoder block and the second decoder block to decode received data based on a specified bit error rate and a detected signal-to-noise ratio of said received data.

In one embodiment, the control circuit reconfigures the first decoder block and the second decoder block based on changes to the detected signal-to-noise ratio to maintain the specified bit error rate.

In one embodiment, the first decoder block comprises a first plurality of computational units, the second decoder block comprises a second plurality of computational units, and the control circuit changes a number of computational units operating in the first and second decoder blocks.

In one embodiment, the computational units comprise Add-Compare-Select (ACS) operational units with an offset.

In one embodiment, the circuit comprises a programmable circuit, and the programmable circuit is partially reconfigured to change the number of computational units operating in the first and second decoder blocks.

In one embodiment, the computational units comprise enable circuits to turn the computational units on and off, and the control circuit turns the computational units operating in the first and second decoder blocks on and off.

In one embodiment, the circuit further comprises a first interleaver to receive the systematic data and generate interleaved systematic data, a second interleaver to receive first likelihood data for said systematic data from the first decoder block and generate interleaved first likelihood data, and a third interleaver, wherein the third interleaver is an inverse of the first interleaver, the third interleaver to receive second likelihood data for said interleaved systematic data from the second decoder block and generate deinterleaved second likelihood data, wherein the first decoder block, the second decoder block, and the first, second, and third interleavers are implemented on a programmable circuit.

In another embodiment, the present invention includes a processing method comprising establishing a connection in a communication system between a first electronic system and a second electronic system, determining a minimum bit-error-rate for the connection, wherein the minimum bit-error-rate is based on identification of the first electronic system establishing said connection, and configuring an iterative multi-stage decoder in the second electronic system to decode digital data received in the second electronic system from the first electronic system, wherein the iterative multi-stage decoder is configured to achieve at least said minimum bit-error-rate.

In one embodiment, the method further comprises determining a minimum throughput for the connection, wherein the minimum throughput is based on identification of the first electronic system establishing said connection, and wherein configuring the iterative multi-stage decoder comprises changing the number of computational units operating in each stage of the iterative multi-stage decoder.

In one embodiment, the iterative multi-stage decoder is configured on a programmable circuit, and configuring the iterative multi-stage decoder comprises partially reconfiguring the programmable circuit with a different number of computational units to maintain the minimum bit-error-rate.

In one embodiment, the second system is a wireless base station and the first system is a first wireless mobile device, and the connection is a first connection with the first wireless mobile device, wherein a first user of the first wireless mobile device has a first service plan specifying a first quality of service, and the minimum bit-error-rate corresponds to the first quality of service, the method further comprising establishing a second connection between a second wireless mobile device and wireless base station, wherein a second user of the second wireless mobile device has a second service plan specifying a second quality of service, determining a second minimum bit-error-rate for the second connection, wherein the second minimum bit-error-rate is based on identification of the second wireless mobile device establishing said connection, and the second minimum bit-error-rate corresponds to the second quality of service, and configuring the iterative multi-stage decoder in the wireless base station to decode digital data received in the wireless base station from the second wireless mobile device, wherein the iterative multi-stage decoder is configured to achieve at least said second minimum bit-error-rate for the second connection that is different from the first minimum bit-error-rate.

DETAILED DESCRIPTION

Figure 1:
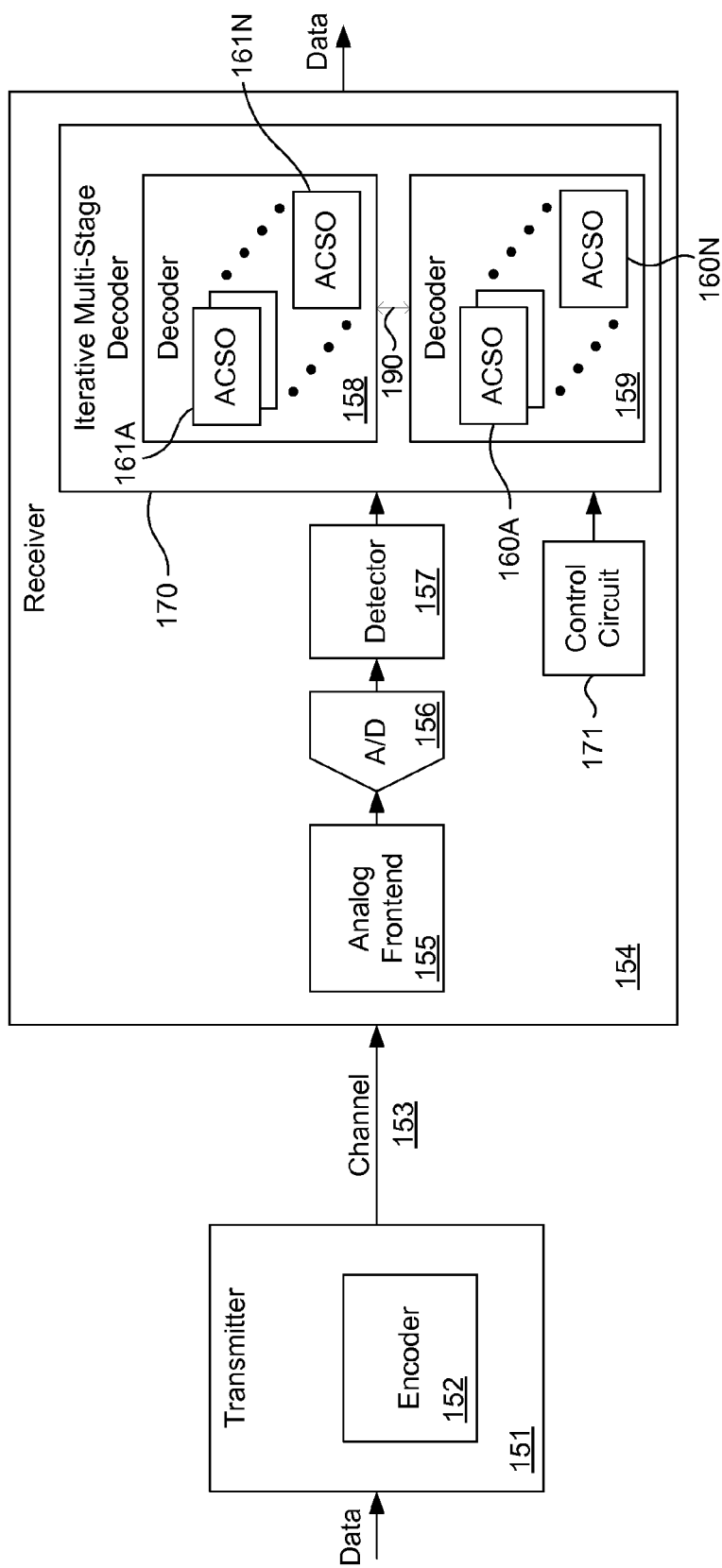
FIG. 1 illustrates changing decoding parameters in a communication system according to one embodiment.

FIG. 1 illustrates changing decoding parameters in a communication system according to one embodiment. One or more embodiments disclosed herein include dynamically changing the processing parameters, such as number of iterations, for example, of a decoder in a receiver based on desired system performance criteria. In this example, a transmitter 151 includes an encoder 152. Transmitter 151 receives data and encoder 152 encodes the data using a particular coding algorithm. The coded data is sent across a communication channel 153, such as a wireless channel, to receiver 154. Receiver 154 includes an analog frontend 155, analog-to-digital converter ("A/D") 156, detector 157, and decoder 170. Decoder 170 is an iterative multi-stage decoder including decoder block 158 and decoder block 159. Example iterative multi-stage decoders include a Turbo decoders and Low Density Parity Check decoders, for example. Analog frontend 155 receives signals over the communication channel 153 and performs preprocessing, such as amplification, demodulation, filtering, or gain control, for example. A/D 156 converts the analog signals into digital data, which was encoded before transmission. Detector 157 receives a time series signal from the A/D 156 at its input and demodulates and equalizes the signal in preparation for channel decoding. Encoded digital data is received in iterative multi-stage decoder 170.

As described in more detail below, some embodiments may include a control circuit 171 that changes a number of iterations performed by decoder 170 to decode received data based on a specified bit error rate and a detected signal-to-noise ratio of the received data. In one embodiment, a bit error rate may be specified, for example, as part of the receiver operating parameters. When the encoded data signal is received in receiver 154, the signal-to-noise ratio for the encoded data signal may be detected. The receiver system may determine a number of decoding iterations for an iterative decoding algorithm to achieve the specified bit error rate for the signal-to-noise ratio of the detected signal. As described in more detail below, iterative decoders may achieve improved bit error rates by iterating a particular decoding algorithm over more iterations. Accordingly, control circuit 171 may configure iterative multi-stage decoder 170 to perform more iterations for low signal-to-noise ratios, and control circuit 171 may configure iterative multi-stage decoder 170 to perform fewer iterations for higher signal-to-noise ratios, for example. Simulations, such as Monte-Carlo simulations, for example, may be used to determine different numbers of decoding iterations required for different signal-to-noise ratios to maintain a particular bit error rate. For example, for a particular LDPC decoder configuration, 28, 22, 16, 11, 7, 5, 4, and 3 decoding iterations may be required for signal-to-noise ratio values on the interval of 0.5, 0.7, 0.9, 1.1, 1.3, 1.5, 1.7, and 1.9 Eb/No to achieve a particular bit error rate target. As described in more detail below, latency and throughput may be maintained over a wide range of signal-to-noise ratios by changing the number of computational units in the decoder stages that are operating in the decoding process as a function of, for example, signal-to-noise ratio. When the signal-to-noise ratio is low, more computational units may be used for a higher degree of parallel processing to reduce latency and increase throughput, and when the signal-to-noise ratio is higher, fewer computations units may be used to save power and resources.

Referring again to FIG. 1, iterative multi-stage decoder 170 includes decoder 158 and decoder 159. Each decoder stage includes computational units for performing decoding tasks. Decoder 158 includes computational units 161A-N and decoder 159 includes computational units 160A-N. In this example, the computational units are Add-Compare-Select (ACS) operational units with an offset ("ACSO"). Computational units 161A-N in decoder 158 and computational units 160A-N in decoder 159 are used to process the encoded data signal digitally to perform an iterative decoding algorithm (e.g., Turbo or LDPC). The resulting decoded data is produced at the output of the receiver, for example.

Decoders 158 and 159 may be configured by control circuit 171 to execute over a determined number of decoding iterations, for example, where the number of decoding iterations is based on the signal-to-noise ratio as described above. Iterative multi-stage decoders according to certain embodiments exchange information at data path 190 during iterations (e.g., likelihoods of intermediate results) of the decoding process to improve the accuracy of the decoding results. In one embodiment, the system detects signal-to-noise ratio of a received signal and reconfigures iterative multi-stage decoder 170 based on changes to the detected signal-to-noise ratio to maintain the specified bit error rate. For instance, if the bit error rate is specified, then control circuit 171 may reconfigure decoder block 158 and decoder block 159 based on changes to the detected signal-to-noise ratio to maintain the specified bit error rate. If the signal-to-noise ratio changes, the number of iterations may be changed, for example. In another embodiment, a number of computational units 160-161 operating in each stage of the iterative multi-stage decoder may change if the signal-to-noise ratio changes. Computational units 160-161 may include enable circuits (not shown) to turn the computational units on and off, for example. Control circuit 171 may change the number of computational units operating in the first and second decoder blocks by turning computational unit circuit blocks on or off by sending signals to the enable circuits in each unit, for example. In one embodiment, portions of the receiver may be implemented in a programmable circuit (e.g., a programmable logic circuit) and the number of computational units used for decoding may be changed by partially reconfiguring the programmable circuit, for example.

Figure 2:
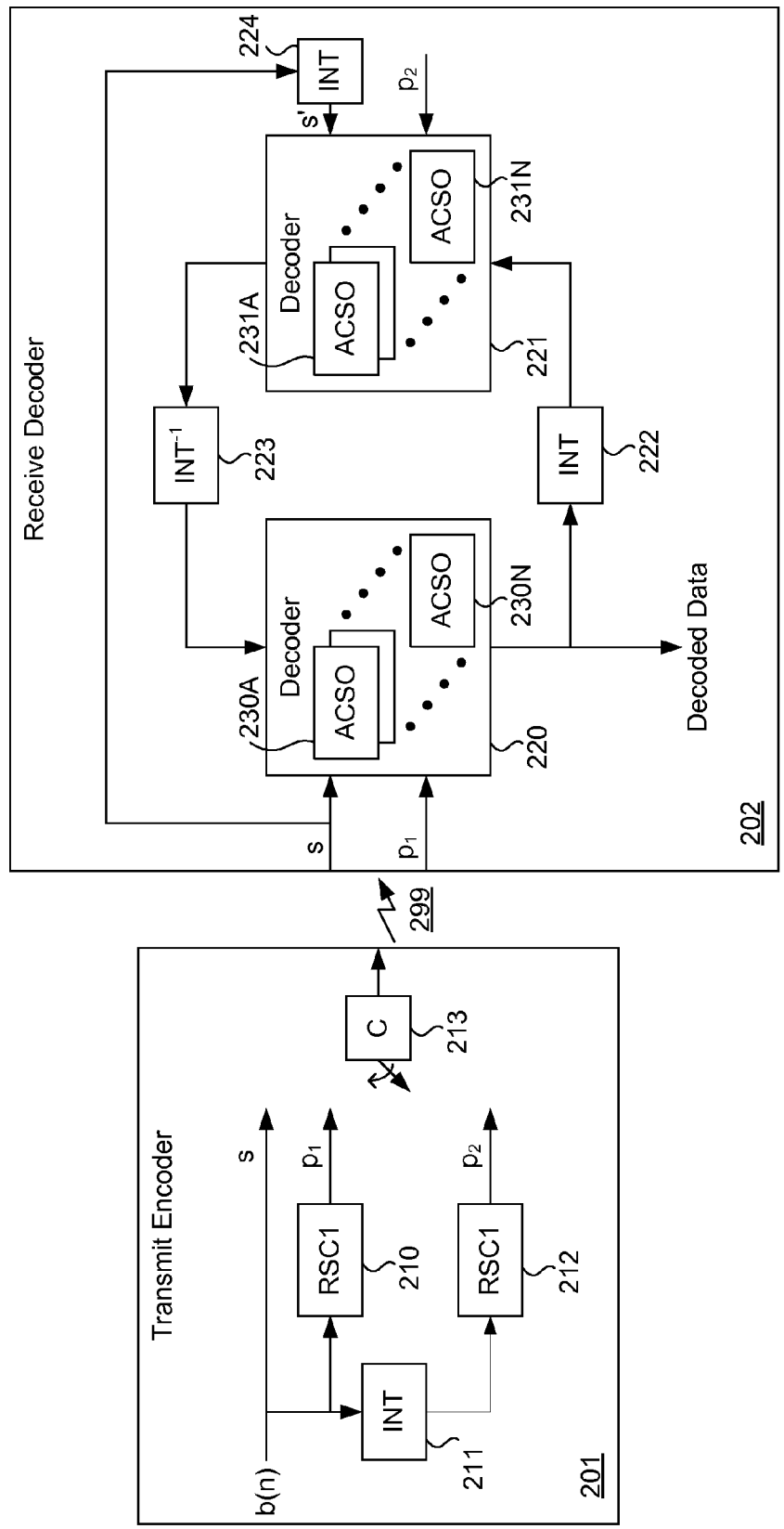
FIG. 2 illustrates an example transmit encoder and receive decoder according to one embodiment.

FIG. 2 illustrates an example transmit encoder and receive decoder according to one embodiment. In this illustrative example, transmit encoder 201 receives a bit stream b(n). As the bits pass toward the output of encoder 201 they are relabeled "s" for "systematic" data, which is a term familiar to those skilled in the art. Encoder 201 creates two parity bit streams, p1 and p2. The first parity bits are generated by encoding systematic bits, s, using a coding algorithm. In this example, the first parity bits are encoded using a recursive systematic coder 210 (RSC1), which may be a linear feedback shift register, for example. Systematic bits, s, are processed by interleaver 211 and encoded by another recursive systematic coder 212 (RSC2) to generate second parity bits, p2. In this example, the systematic bits and the two parity bit streams are combined in commutator 213 to form a combined bit stream for transmission. The following simple example illustrates the bit streams:
s=[b0, b1, b2, b3, b4, b5, b6, b7, b8, ...],
p1=[p01, p11, p21, p31, p41, p51, p61, p71, p81, ...], and
p2=[p02, p12, p22, p32, p42, p52, p62, p72, p82, ...].
Parity bits p2 are parity bits for the interleaved systematic bits, and are substantially uncorrelated from parity bits p1. In this example, the output of commutator 213 is: [b0, p01, p02, b1, p11, p12, ...]. The commutated data may be transmitted across the communication channel 299 and provided to the receive decoder 202.

Receive decoder 202 receives the systematic data, s, first parity bits, p1, and second parity bits, p2. Decoder 202 is an example of a Turbo decoder, which includes decoder 220, decoder 221, and interleavers 222-224. Interleaver 223 performs an inverse interleave function as compared to interleavers 211, 222, and 224. Decoder 220 receives systematic data, s, and first parity bits, p1. Decoder 220 includes computational units 230A-N, which in this example are ACSO units. Similarly, decoder 221 also receives systematic data and second parity bits, p2. However, because the second parity bits are generated using interleaved systematic data in the encoder, interleaver 224 is configured between the systematic data, s, and an input of decoder 221 so that the systematic data sequence operated on by decoder 221 corresponds to the second parity bits, p2. Decoder 221 similarly includes computational units 231A-N, which in this example are also ACSO units. Decoders 220-221 may be maximum a posteriori (MAP) decoders, for example.

Decoders 220-221 receive a systematic data input, parity bits, and information from the other decoder. In this example, decoder 220 receives systematic data s, parity data p1, and likelihood information from decoder 221. Decoder 220 outputs likelihood values for each received systematic data bit. Similarly, decoder 221 receives interleaved systematic data s', parity data p2, and likelihood information from decoder 220. Decoder 221 outputs likelihood values. The likelihood values provide information about each of the particular systematic bits processed by each decoder. For example, likelihood values may range between positive and negative values (e.g., 2.4, −1.74, 5.123, 1.8, −0.6, ... ). More positive values may indicate the bit is likely a '1'. More negative values may indicate the bit is likely a '0'. Values close to zero may indicate that the bit value is uncertain. The likelihood values generated by decoder 220 are coupled to interleaver 222, and the interleaved likelihood values from decoder 220 are provided as an input to decoder 221. Similarly, the likelihood values generated by decoder 221 are coupled to interleaver 223 (the inverse of interleaver 222), and the interleaved likelihood values from decoder 221 (or deinterleaved values with respect to systematic data, s) are provided as an input to decoder 220. Likelihood values generated by decoder 220 and sent to decoder 221 are denoted $L_{12}^e$. Likelihood values generated by decoder 221 and sent to decoder 220 are denoted $L_{12}^e$. Initially, on the first iteration decoders 220 and 221 generate outputs with no likelihood inputs from the other decoder stage. On a second iteration, likelihood outputs from the other decoders are used to improve the likelihood values generated by each decoder. The likelihood values generated on each iteration are used to improve the likelihood values of later iterations. Additional iterations improve the bit error rate but increase the latency due to processing time and reduce throughput.

In this example, the likelihood values generated by each decoder are improved by the likelihood values from the other decoder, but the likelihood values only represent new information obtained on a particular iteration. The "e" in the denotation of likelihood values refers to extrinsic information represented by the likelihood values. For instance, in one embodiment, likelihood values are generated by a decoder and the input likelihood values are subtracted from the generated likelihood values to obtain the new (or extrinsic) information. Thus, embodiments may output only what was learned on a particular iteration cycle, for example.

As mentioned above, the number of iterations impacts the bit error rate. Thus, it would be desirable to increase the iterations for low signal-to-noise ratios to maintain the bit error rate above some threshold. In one embodiment, the number of iterations is set based on the signal-to-noise ratio, and decoder 202 executes the set number of iterations. In one embodiment, a cycle redundancy check (CRC) may be performed after each iteration. If the data passes the CRC, the system may terminate the iterations before reaching the set number of iterations, for example. When the iteration cycles are completed, the likelihood values are provided at the output of decoder 220.

Figure 3:
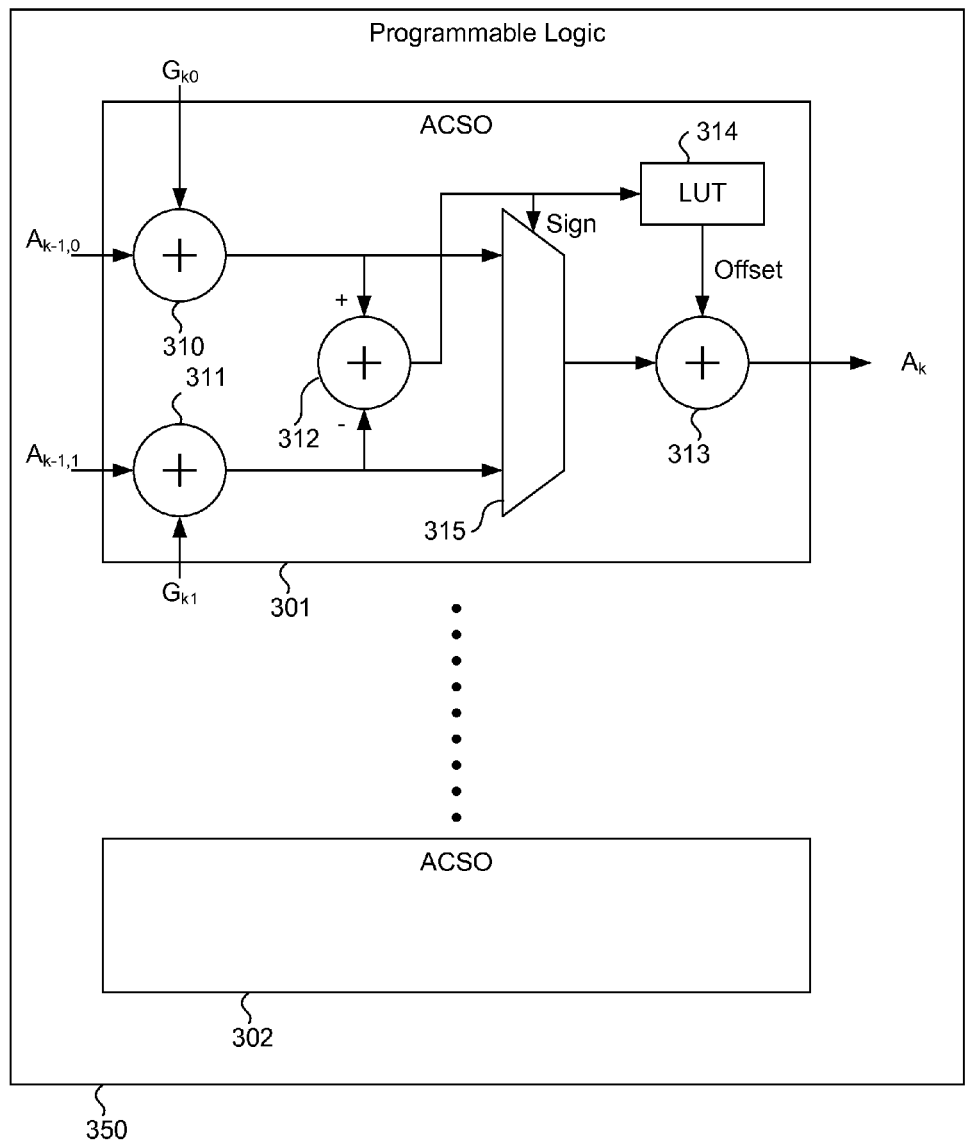
FIG. 3 illustrates a programmable device with dynamic decoding according to one embodiment.

FIG. 3 illustrates a programmable device with dynamic decoding according to one embodiment. In one embodiment, decoders may be implemented on a programmable device 350. Iterative multi-stage decoders, such as Turbo decoders and LDPC decoders, may perform the same calculations across multiple nodes of a trellis, for example. Thus, such circuits may have many instances of the same computational units mentioned above. In certain embodiments, changing the number of computational units may include turning the computational units on or off, as mentioned above, or partially reconfiguring the programmable device. In another embodiment, blocks 301 and 302 may be implemented as software routines on a processor, for example, and different numbers of such blocks are accessed through calls to software routines. This example illustrates a particular implementation of ACSO computational units 301-302 on a programmable device 350. ACSO 301 includes adders 310-313, multiplexer 315, and lookup table 314. Decoders implementing a Turbo code, for example, may require many ACSO units to process values across a trellis. Adder 310 receives a first branch probability, $G_{k0}$, and forward state metric, $A_{k-1,0}$ from a previous iteration and adder 311 receives a different branch probability, $G_{k,1}$, and forward state metric, $A_{k-1,1}$ from a previous iteration. The offset is provided as a correction factor to generate forward state probability $A_k$.

Figure 4:
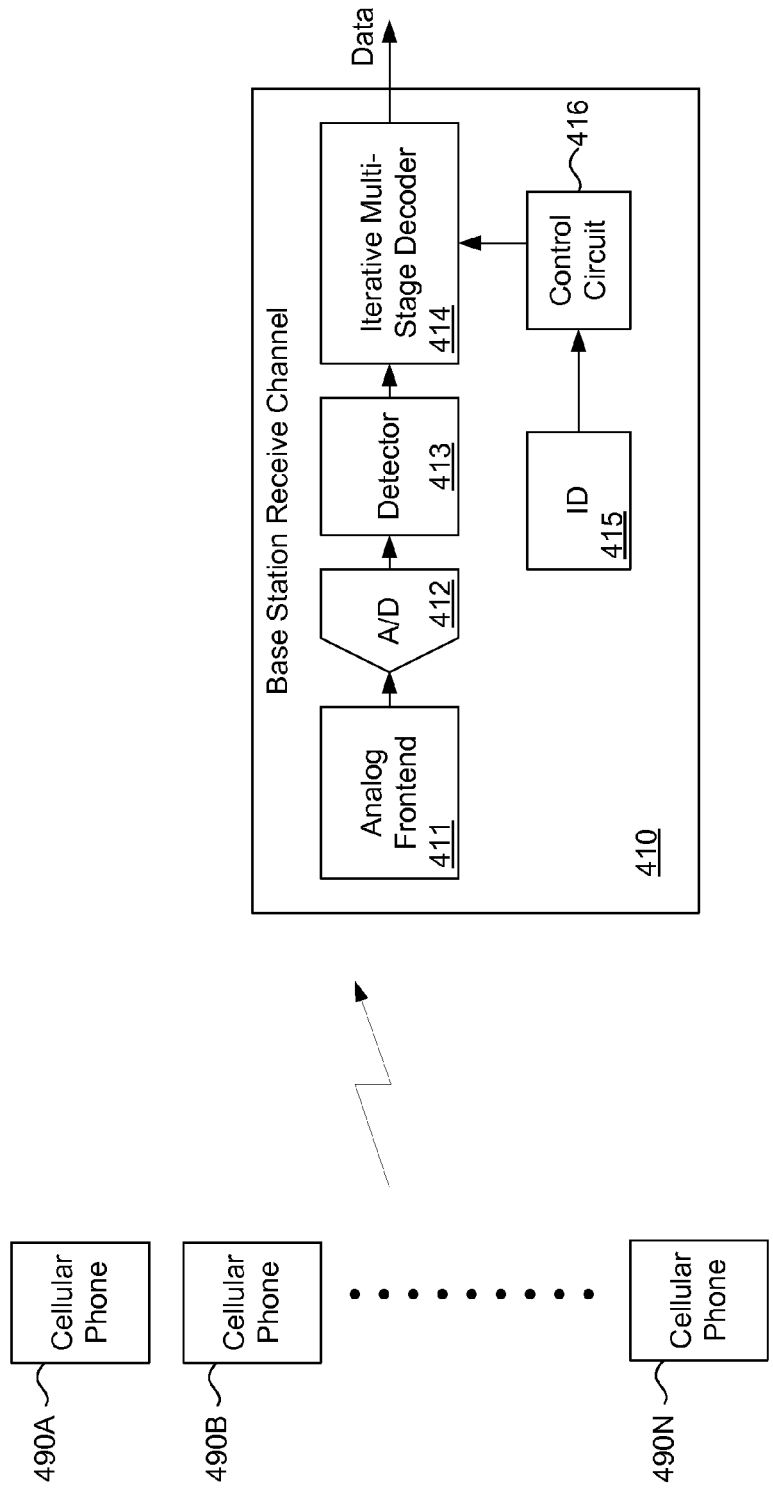
FIG. 4 illustrates changing parameters of a decoder for different qualities of service according to another embodiment.

FIG. 4 illustrates changing parameters of a decoder for different qualities of service according to another embodiment. Quality of service is described in the context of an example using cellular communications. For example, wireless mobile devices (e.g., cellular phones 490A-N) may establish connections in a wireless communication system with a base station including one or more receive channels 410. As more and more cellular phones access the base station channel, the demand for decoding resources goes up. In some instances it may be desirable to ensure a minimum bit error rate for some customers. Customers may pay for service plans with wireless carriers who operate the base stations that may ensure a minimum bit error rate and/or throughput, for example. The decoder in the base station receive channel may be changed to provide different operating parameters for different customers based on the agreements they have with the cellular carriers operating the site. In one embodiment, when a connection between a cellular phone and the base station is established, the base station determines an identification of the cellular phone establishing the connection. For example, the receive channel 410 may determine an identification of the cellular phone. Using the identification of the cellular phone, the base station may determine a minimum bit error rate base on the identification of the cellular phone establishing the connection (e.g., based on operational parameters associated with the cellular phone ID). Receive channel 410 includes an analog frontend 411, A/D 412, detector 413, and iterative multi-stage decoder 414. ID block 415 may determine the cellular phone establishing the call and retrieve parameters for configuring decoder 414. Control circuit 416 may receive the decoder parameters from ID block 415 and configure the decoder to perform, for example, the necessary iterations for achieving a particular minimum bit error rate proscribed by the caller's plan. Receive channel 410 may detect a signal-to-noise ratio to set the iterations necessary to meet the call's plan requirements, for example. In one embodiment, a minimum throughput for the cellular phone establishing the connection is determined. It is to be understood that minimum throughput is equivalent to maximum latency, and the system may set either by adjusting the parameters of the decoder. The minimum throughput requirement may also be determined, for example, by identifying the cellular phone establishing the connection. The iterative multi-stage decoder 414 may be changed to meet different throughput requirements by changing the number of computational units operating in each stage of the decoder. As described above, computational units may be turned on or off through enable circuits (e.g., in an application specific integrated circuit (ASIC)). Alternatively, decoder 414 may be implemented in whole or in part on a programmable circuit and additional or fewer computational units may be incorporated into the decoder by partially reconfiguring the programmable circuit (e.g., after the throughput requirement is determined by identifying the cell phone). Accordingly, a first cellular phone 490A may establish a connection with base station receive channel 410, the phone is identified, and a minimum bit error rate or throughput is established by programming the decoder 414 with first iterations and a first number of computational units. A second cellular phone 490B may establish another connection with base station receive channel 410, the second phone is identified, and a different minimum bit error rate or a different throughput is established by programming the decoder 414 with second iterations and a second number of computational units, for example. When the first phone is identified, a programmable circuit is partially reconfigured so that the decoder performs a number of iterations sufficient to ensure a minimum bit error rate. The programmable circuit may be partially reconfigured to include a number of computation units necessary for meeting a minimum throughput (maximum latency). When the second phone is identified, the programmable circuit may be partially reconfigured so that the decoder performs a different number of iterations sufficient to ensure a different minimum bit error rate. The programmable circuit may be partially reconfigured to include fewer or additional computation units necessary for meeting a different minimum throughput. While the above example shows an example application directed to wireless cellular networks, it is to be understood that the above technique is applicable to connections between other electronic devices in other communication systems.

Figure 5:
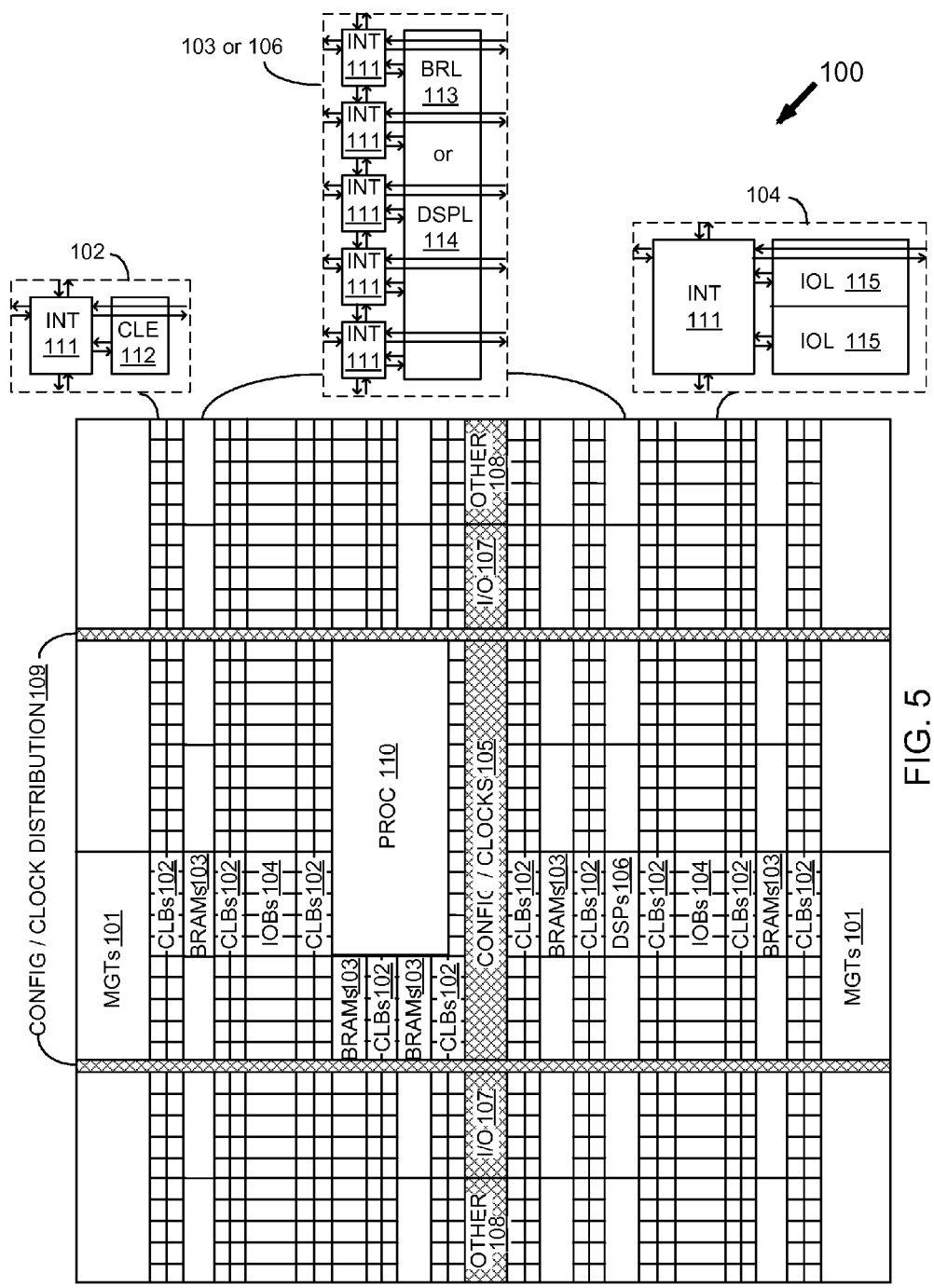
FIG. 5 is a block diagram of a programmable device for implementing the circuits according to an embodiment.

FPGAs can include several different types of programmable blocks in an array. The following illustrates one example of a programmable device that may be used to implementing the process and circuits for changing decoder performance described above. An FPGA may be partially reconfigured to include additional or fewer computational units for performing decoding. The example in FIG. 5 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable blocks 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable element within the same tile, as shown by the examples included at the top of FIG. 5.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An 10B 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 5) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 110 shown in FIG. 5 spans several columns of CLBs and BRAMs.

Note that FIG. 5 is intended to illustrate only an exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 5 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

One or more embodiments disclosed above are thought to be applicable to a variety of configurable processing functions used in communication systems. Other aspects and embodiments will be apparent to those skilled in the art from consideration of the specification and practice of the techniques disclosed herein. It is intended that the specification and illustrated embodiments be considered as examples only, with a true scope and spirit of the invention being indicated by the following claims.

What is claimed is:

1. A method comprising:
   specifying a bit error rate;
   receiving an encoded data signal in a receiver;
   detecting a signal-to-noise ratio for the encoded data signal;
   determining a number of decoding iterations for an iterative decoding algorithm to achieve the specified bit error rate for the detected signal-to-noise ratio;
   processing the encoded data signal digitally in an iterative multi-stage decoder in the receiver, wherein the iterative multi-stage decoder performs said iterative decoding algorithm for said determined number of decoding iterations; and
   reconfiguring the iterative multi-stage decoder to change a number of computational units thereof based on changes in the detected signal-to-noise ratio.

2. The method of claim 1, wherein the reconfiguring of the iterative multi-stage decoder based on changes to the detected signal-to-noise ratio is to maintain the specified bit error rate.

3. The method of claim 2, wherein the reconfiguring of the iterative multi-stage decoder comprises changing the number of computational units operating in each stage of the iterative multi-stage decoder.

4. The method of claim 3, wherein at least a portion of the iterative multi-stage decoder is configured on a programmable circuit, and wherein reconfiguring the iterative multi-stage decoder comprises partially reconfiguring the programmable circuit with a different number of computational units based on said detecting the signal-to-noise ratio for the encoded digital data signal.

5. The method of claim 3, wherein the computational units comprise Add-Compare-Select (ACS) operational units with an offset.

6. The method of claim 1, wherein the iterative multi-stage decoder is a Turbo decoder.

7. The method of claim 1, wherein the iterative multi-stage decoder is a Low Density Parity Check (LDPC) decoder.

8. A circuit comprising:
   a first decoder block to receive systematic data and first parity bits, wherein the first parity bits are generated by coding the systematic data using a first coding algorithm;
   a second decoder block to receive interleaved systematic data and second parity bits, wherein the second parity bits are generated by coding interleaved systematic data before transmission using said first coding algorithm so that the first parity bits and second parity bits are substantially uncorrelated; and
   a control circuit, the control circuit changing a number of iterations performed by the first decoder block and the second decoder block to decode received data based on a specified bit error rate and a detected signal-to-noise ratio of said received data.

9. The circuit of claim 8, wherein the control circuit reconfigures the first decoder block and the second decoder block based on changes to the detected signal-to-noise ratio to maintain the specified bit error rate.

10. The circuit of claim 9, wherein the first decoder block comprises a first plurality of computational units, wherein the second decoder block comprises a second plurality of computational units, and wherein the control circuit changes a number of computational units operating in the first and second decoder blocks.

11. The circuit of claim 10, wherein the computational units comprise Add-Compare-Select (ACS) operational units with an offset.

12. The circuit of claim 10, wherein the circuit comprises a programmable circuit, and wherein the programmable circuit is partially reconfigured to change the number of computational units operating in the first and second decoder blocks.

13. The circuit of claim 10, wherein the computational units comprise enable circuits to turn the computational units on and off, and wherein the control circuit turns the computational units operating in the first and second decoder blocks on and off.

14. The circuit of claim 8, further comprising:
   a first interleaver to receive the systematic data and generate interleaved systematic data;
   a second interleaver to receive first likelihood data for said systematic data from the first decoder block and generate interleaved first likelihood data; and
   a third interleaver, wherein the third interleaver is an inverse of the first interleaver, the third interleaver to receive second likelihood data for said interleaved systematic data from the second decoder block and generate deinterleaved second likelihood data, wherein the first decoder block, the second decoder block, and the first, second, and third interleavers are implemented on a programmable circuit.

15. A method comprising:

establishing a connection in a communication system between a first system and a second system;

determining a minimum bit-error-rate for the connection, wherein the minimum bit-error-rate is based on identification of the first system establishing said connection; and configuring an iterative multi-stage decoder in the second system to decode digital data received in the second system from the first system, wherein the iterative multi-stage decoder achieves at least said minimum bit-error-rate.

16. The method of claim 15, further comprising determining a minimum throughput for the connection, wherein the minimum throughput is based on identification of the first system establishing said connection, and wherein configuring the iterative multi-stage decoder comprises changing the number of computational units operating in each stage of the iterative multi-stage decoder.

17. The method of claim 15, wherein the iterative multi-stage decoder is configured on a programmable circuit, and wherein configuring the iterative multi-stage decoder comprises partially reconfiguring the programmable circuit with a different number of computational units to maintain the minimum bit-error-rate.

18. The method of claim 15, wherein the second system is a wireless base station and the first system is a first wireless mobile device, and wherein the connection is a first connection with the first wireless mobile device, wherein a first user of the first wireless mobile device has a first service plan specifying a first quality of service, and the minimum bit-error-rate corresponds to the first quality of service, the method further comprising:

establishing a second connection between a second wireless mobile device and wireless base station, wherein a second user of the second wireless mobile device has a second service plan specifying a second quality of service;

determining a second minimum bit-error-rate for the second connection, wherein the second minimum bit-error-rate is based on identification of the second wireless mobile device establishing said connection, and the second minimum bit-error-rate corresponds to the second quality of service; and configuring the iterative multi-stage decoder in the wireless base station to decode digital data received in the wireless base station from the second wireless mobile device, wherein the iterative multi-stage decoder is configured to achieve at least said second minimum bit-error-rate for the second connection that is different from the first minimum bit-error-rate.

19. The method of claim 15, wherein the iterative multi-stage decoder is a Turbo decoder.

20. The method of claim 15, wherein the iterative multi-stage decoder is a Low Density Parity Check (LDPC) decoder.

* * * * *